US007364369B2

(12) United States Patent
Sakurai et al.

(10) Patent No.: US 7,364,369 B2

(45) Date of Patent: Apr. 29, 2008

(54) LEAD FRAME, OPTICAL COUPLING PART USING LEAD FRAME, AND MANUFACTURING METHOD OF OPTICAL COUPLING PART

(75) Inventors: Wataru Sakurai, Kanagawa (JP); Kazuhito Saito, Kanagawa (JP); Hideo Numata, Tokyo (JP); Chiaki Takubo, Tokyo (JP); Hideto Furuyama, Tokyo (JP); Hiroshi Hamasaki, Tokyo (JP)

(73) Assignees: Sumitomo Electric Industries, Ltd., Osaka (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/711,862

(22) Filed: Feb. 28, 2007

(65) Prior Publication Data

US 2007/0212001 A1 Sep. 13, 2007

(30) Foreign Application Priority Data

Feb. 28, 2006 (JP) .......................... P.2006-052653

(51) Int. Cl.
*G02B 6/36* (2006.01)

(52) U.S. Cl. ............................ 385/89; 385/49; 385/88; 257/99

(58) Field of Classification Search .................. 385/14, 385/49, 88, 89; 257/99
See application file for complete search history.

(56) References Cited

U.S. PATENT DOCUMENTS 7,301,139 B1 * 11/2007 Sakurai et al. ......... 250/227.11
2005/0063651 A1 3/2005 Hamasaki et al.
2005/0169596 A1 8/2005 Hamasaki et al.
2006/0039658 A1 2/2006 Furuyama et al.
2006/0291783 A1 12/2006 Hamasaki et al.
2007/0053637 A1 * 3/2007 Golwalkar et al. ........... 385/88

FOREIGN PATENT DOCUMENTS

JP 2001-159724 6/2001
JP 2005-43622 2/2005

OTHER PUBLICATIONS

U.S. Appl. No. 11/531,922, filed Sep. 14, 2006.

* cited by examiner

*Primary Examiner*—Hemang Sanghavi
(74) *Attorney, Agent, or Firm*—McDermott Will & Emery LLP

(57) ABSTRACT

When a resin 59 to form a molded body 20 is poured and a lead frame 30 is attached to a front end face 21 of the molded body 20 by insert molding, protective leads 32 provided on both outsides of a lead pattern 31 of the lead frame 30 moderate the flow of the resin 59 and the force acting on the lead pattern 31 is decreased, so that misregistration of the lead pattern 31 can be prevented. Accordingly, the inserted and molded lead frame 30 can be wired on the front end face 21 of the molded body 20 for easily accomplishing three-dimensional electric wiring.

6 Claims, 5 Drawing Sheets

LEAD FRAME, OPTICAL COUPLING PART USING LEAD FRAME, AND MANUFACTURING METHOD OF OPTICAL COUPLING PART

TECHNICAL FIELD

The present disclosure to a lead frame, an optical coupling part using the lead frame, and a manufacturing method of the optical coupling part and, for example, relates to a lead frame for making electric connection to a photoelectric conversion unit, an optical coupling part using the lead frame, and a manufacturing method of the optical coupling part.

RELATED ART

Demands for speeding up and a larger capacity also grow for a router on a network node and further a home information appliance with the development of a broadband. To meet the demands, introduction examination of optical interconnection for executing E/O conversion in an input/output portion of electric transmission and performing high-speed and large-capacity transmission utilizing the wideband characteristic of an optical fiber moves forward. An art for coupling photoelectric conversion elements (light-emitting element and light-receiving element) and an optical fiber in an E/O conversion portion is disclosed. (For example, refer to Patent Document 1: Japanese Patent Unexamined Publication No. 2005-43622(FIG. 1).)

As shown in FIG. 6, an optical coupling part 100 described in Patent Document 1 has a molded body 104 for mechanically holding an optical fiber 101 in a holding hole 102 with an optical input/output end face 103 of the optical fiber 101 exposed onto a principal plane, and electric wiring 105 is provided on the principal plane of the molded body 104. A photosemiconductor 107 is provided through an insulating film 106 ahead of the optical fiber 101 and is connected to the electric wiring 105 by a bump 108.

In a manufacturing method of the optical coupling part described in Patent Document 1, Patent Document 1 describes that the flexibility of the coupling position is enhanced as the optical coupling part has the electric wiring formed over the top of the principal plane and the top of a side face of the molded body 104. However, it is difficult to form such three-dimensional electric wiring continuously on the object surface.

SUMMARY

Embodiments of the present invention provide a lead frame to make it possible to easily accomplish three-dimensional electric wiring, an optical coupling part using the lead frame, and a manufacturing method of the optical coupling part.

According to one or more embodiments of the present invention, there is provided a lead frame inserted and molded into a molded body for allowing a plurality of optical fibers to be inserted and exposed, the lead frame comprising: a lead pattern wired on a front end face of the molded body for making electric connection to a photoelectric conversion unit placed facing the optical fibers; and protective leads which are provided at both outside positions of the lead pattern and protects the lead pattern.

In the described lead frame, when a resin to form the molded body is poured and the lead frame is attached to the front end face of the molded body by insert molding, the protective leads provided on both outsides of the lead pattern of the lead frame moderate the flow of the resin and the force acting on the lead pattern is decreased, so that misregistration and deformation of the lead pattern can be prevented. Accordingly, the inserted and molded lead frame can be wired on the front end face of the molded body for easily accomplishing three-dimensional electric wiring.

Preferably, in the lead frame according to the present invention, the protective leads are provided in a state of a beam with both ends supported on the lead frame.

In the described lead frame, the protective leads provided on both outsides of the lead pattern are supported in the state of the beam with both ends supported on the lead frame, so that a sufficient strength can be given to the protective leads. Thus, the flow of the resin poured when the molded body is molded can be moderated for protecting the lead pattern and a move and deformation of the lead pattern can be prevented reliably.

According to the present invention, there is provided an optical coupling part comprising: a molded body for allowing a plurality of optical fibers to be inserted and exposed; a photoelectric conversion unit placed facing the optical fibers; a lead frame inserted and molded into the molded body, the lead frame having a lead pattern, which is wired on a front end face of the molded body and makes electric connection to the photoelectric conversion unit, and protective leads, which are provided at both outside positions of the lead pattern in the lead frame and protects the lead pattern.

In the described optical coupling part, when the molded body is molded, the lead frame is attached to the front end face of the molded body by insert molding. At this time, when a resin to form the molded body is poured, the protective leads provided on both outsides of the lead pattern of the lead frame moderate the flow of the resin and the force acting on the lead pattern is decreased, so that misregistration of the lead pattern can be prevented. Accordingly, the inserted and molded lead frame can be wired on the front end face of the molded body for easily accomplishing three-dimensional electric wiring.

According to the present invention, there is provided a manufacturing method of an optical coupling part, comprising: preparing a lead frame having a lead pattern for making electric connection to a photoelectric conversion unit placed facing a plurality of optical fibers and protective leads provided on both outsides of the lead pattern; and executing insert molding of the lead frame into a front end face of a molded body for allowing the optical fibers to be inserted and exposed, wherein when insert molding of the lead frame into the molded body is executed, the lead pattern is protected by the protective leads.

In the described manufacturing method of the optical coupling part, when the molded body is molded, the lead frame is attached to the front end face of the molded body by insert molding. When a resin to form the molded body is poured, the protective leads provided on both outsides of the lead pattern of the lead frame moderate the flow of the resin and the force acting on the lead pattern is decreased, so that the lead pattern can be protected for preventing misregistration thereof. Accordingly, the inserted and molded lead frame can be wired on the front end face of the molded body for easily accomplishing three-dimensional electric wiring.

One or more embodiments of the present invention may include one or more the following advantages. For example, since the protective leads are provided on both outsides of the lead pattern of the lead frame, when a resin to form the molded body is poured and the lead frame is attached to the front end face of the molded body by insert molding, the protective leads moderate the flow of the resin and the force acting on the lead pattern is decreased. Accordingly, mis-registration of the lead pattern can be prevented and the inserted and molded lead frame can be wired on the front end face of the molded body for easily accomplishing three-dimensional electric wiring.

Other features and advantages may be apparent from the following detailed description, the accompanying drawings and the claims.

DETAILED DESCRIPTION

An embodiment according to the present invention will be discussed in detail based on the accompanying drawings.

Figure 1:
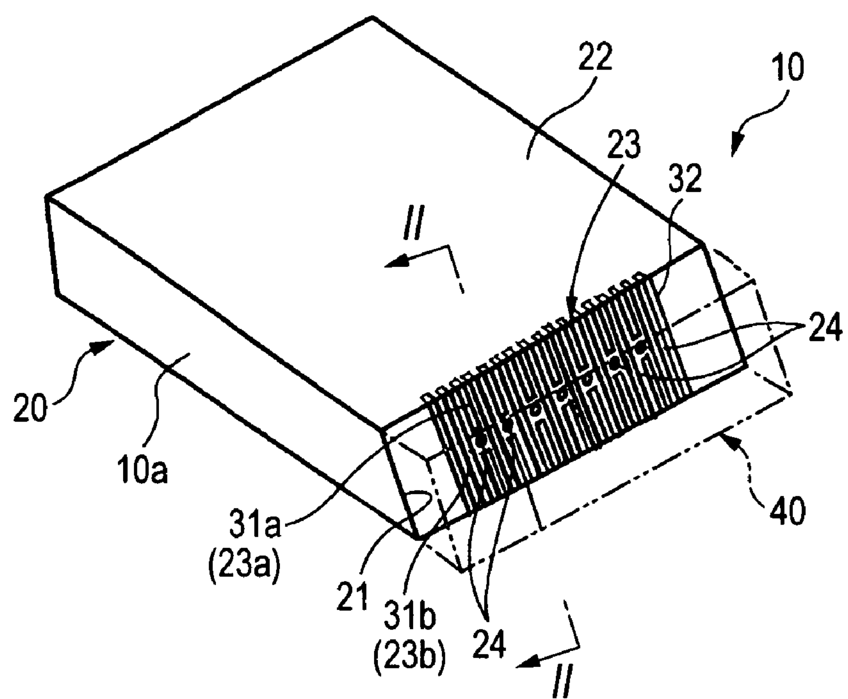
FIG. 1 is a perspective view showing a molded body of an optical coupling part using a lead frame of the present invention.
Figure 2:
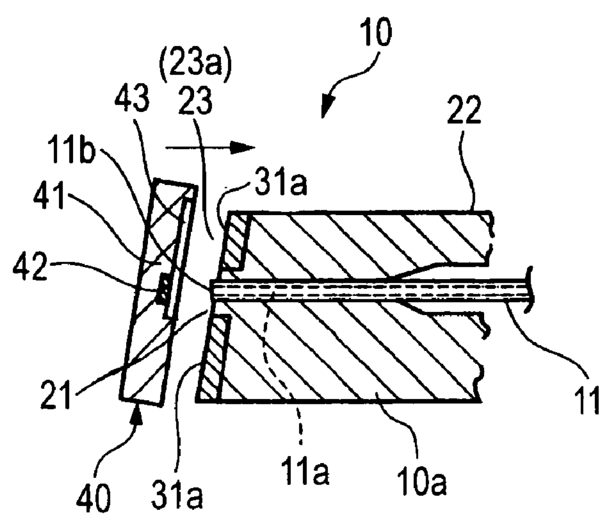
FIG. 2 is a sectional view showing the front of the optical coupling part using the lead frame of the present invention.
Figure 3A:
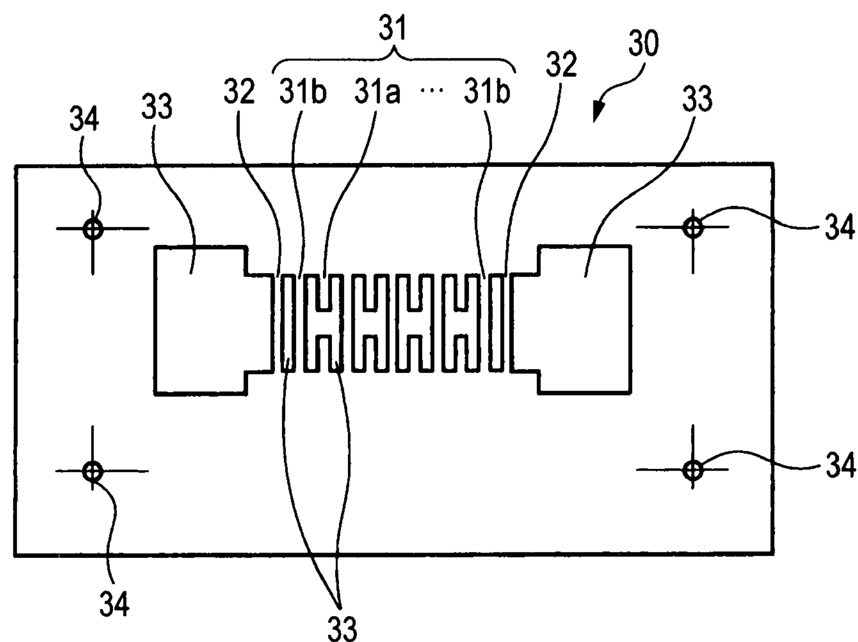
FIG. 3A is a plan view showing the lead frame according to the present invention.
Figure 3B:
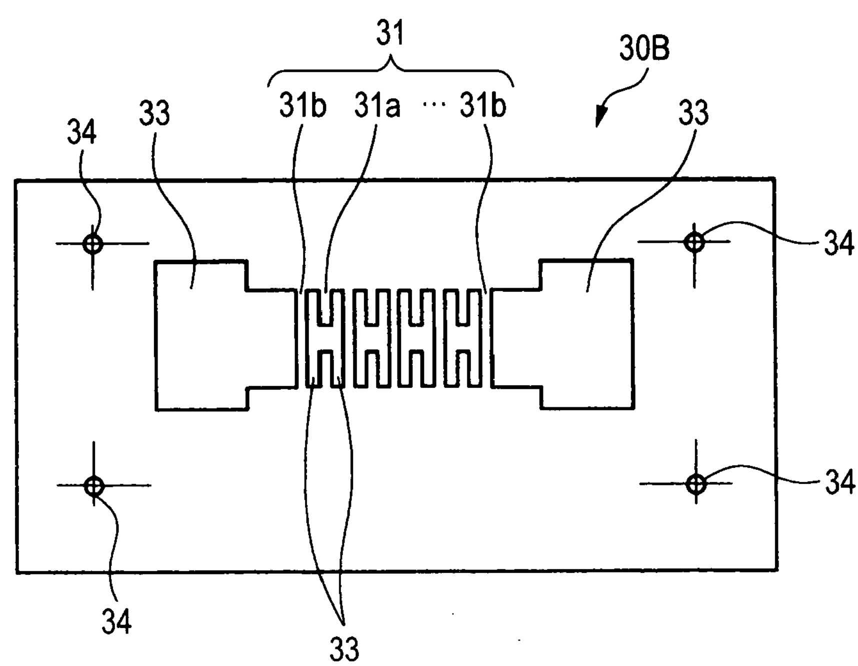
FIG. 3B is a plan view showing a lead frame in a related art.
Figure 4:
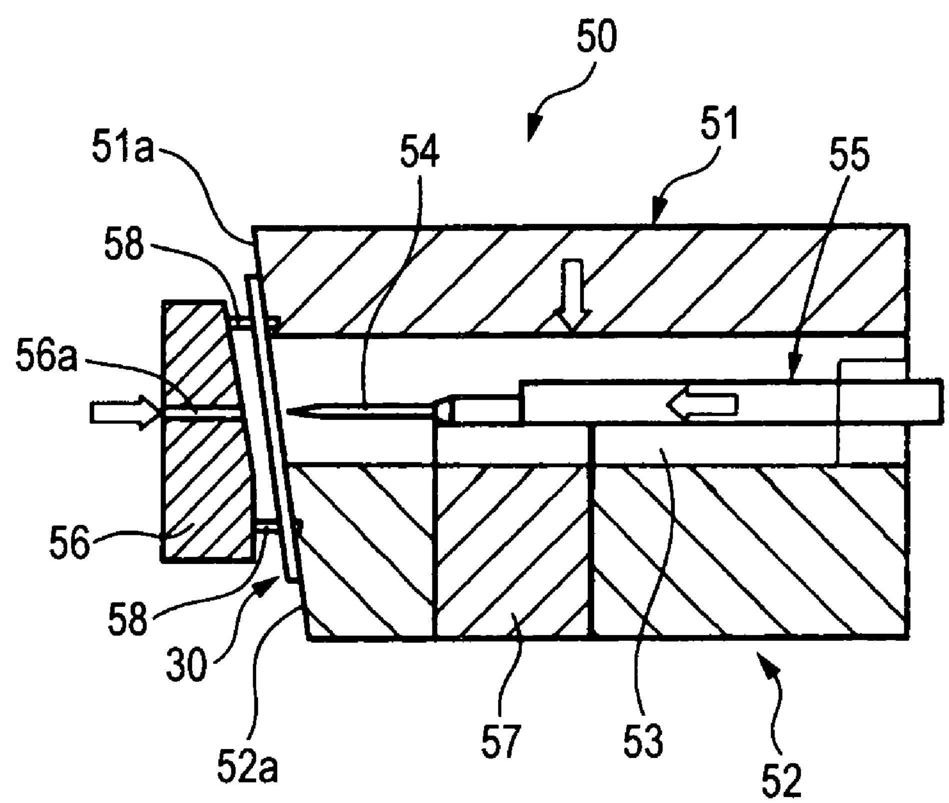
FIG. 4 is a sectional view showing a mold for molding a molded body of an optical coupling part into which the lead frame according to the present invention is inserted and molded.
Figure 5:
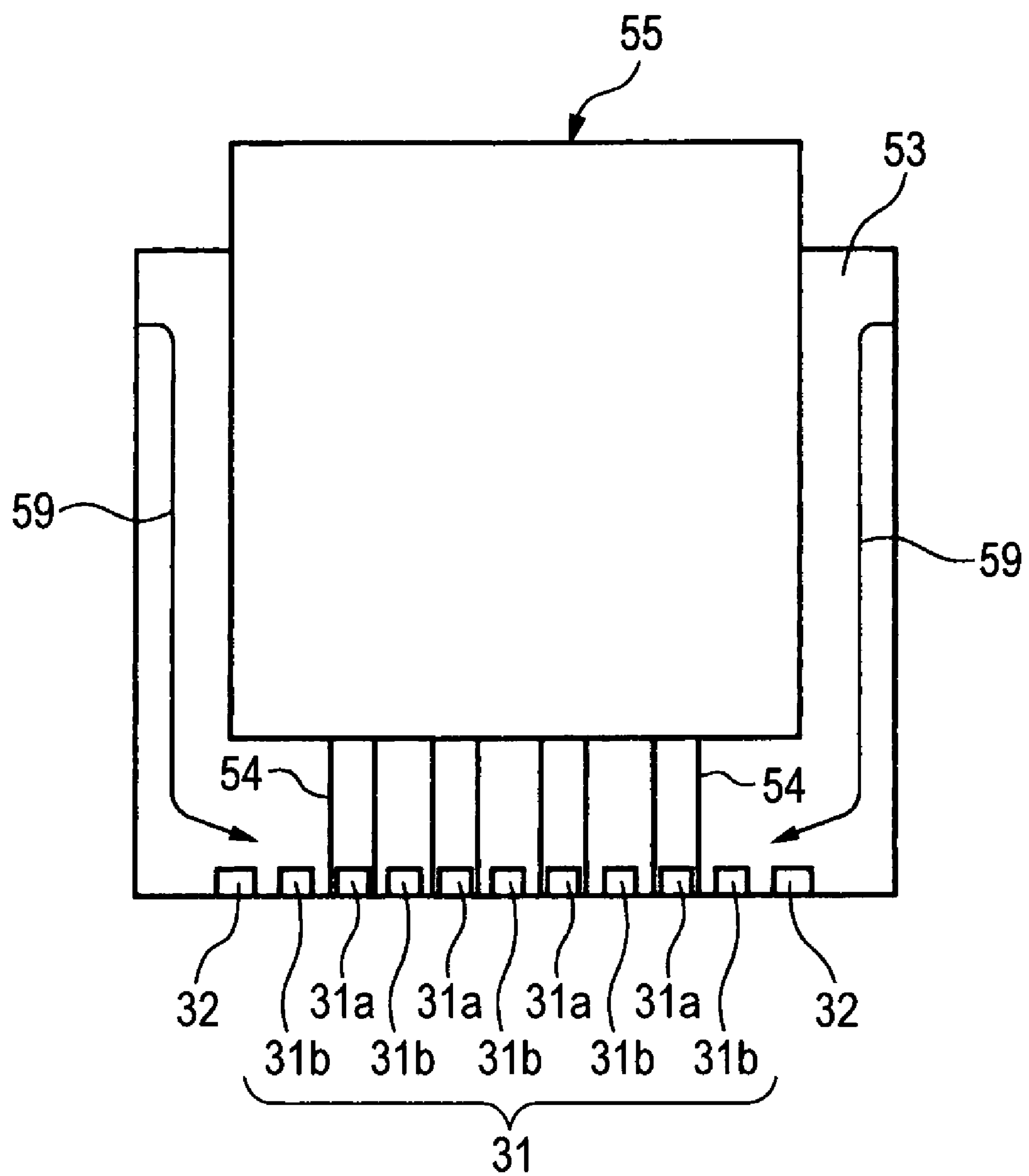
FIG. 5 is a plan view showing a move of resin poured for molding the molded body.
Figure 6:
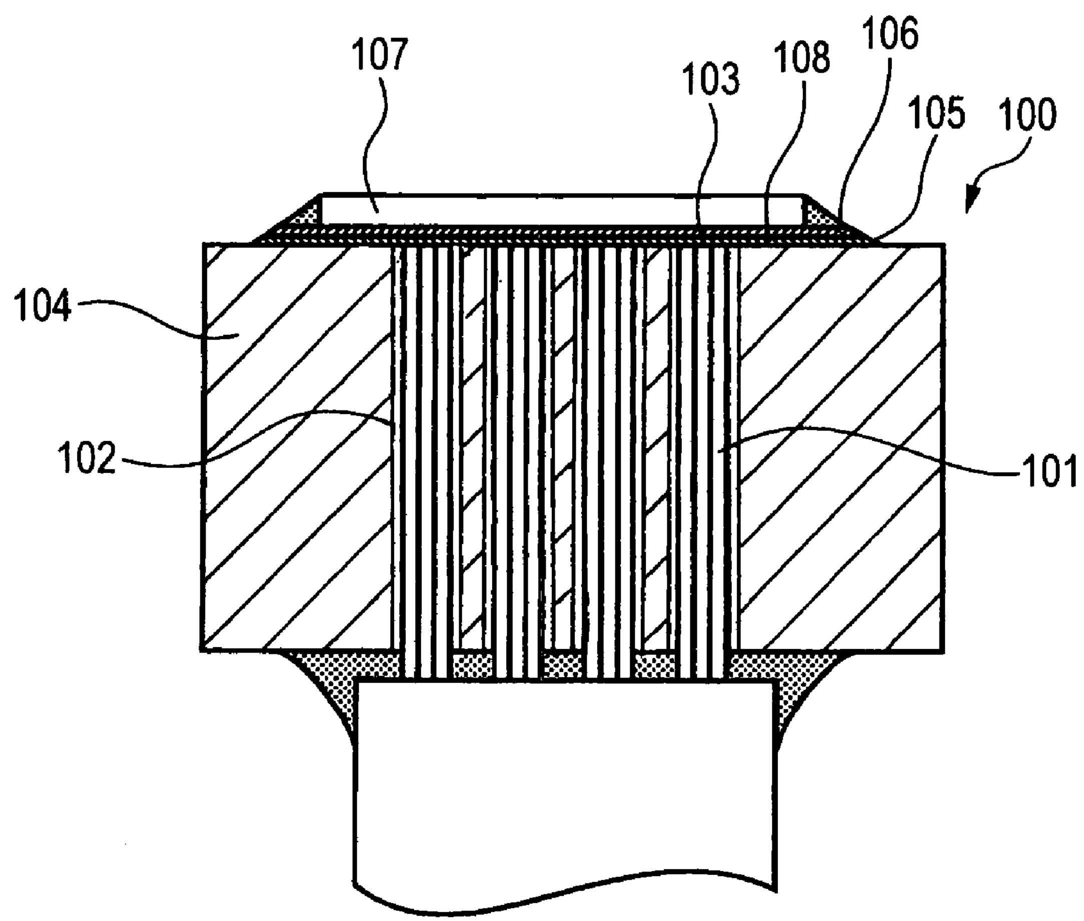
FIG. 6 is a sectional view showing an optical coupling part in a related art.

FIG. 1 is a perspective view showing a molded body of an optical coupling part using a lead frame of the present invention. FIG. 2 is a sectional view showing the front of the optical coupling part using the lead frame of the present invention. FIG. 3A is a plan view showing the lead frame according to the present invention. FIG. 3B is a plan view showing a lead frame in a related art. FIG. 4 is a sectional view showing a mold for molding a molded body of an optical coupling part into which the lead frame according to the present invention is inserted and molded. FIG. 5 is a plan view showing a flow of resin poured for molding the molded body.

As shown in FIGS. 1 and 2, an optical coupling part 10 is provided with a lead frame 30 inserted and molded into a molded body 20 for allowing a plurality of optical fibers 11 to be inserted and exposed. The lead frame 30 has a lead pattern 31 bent and wired on a front end face 21 of the molded body 20 and exposed on a side face 22 continuous to the front end face 21, and supplies power to a photoelectric conversion unit 40 placed facing the optical fibers 11. A protective lead 32 for protecting the lead pattern 31 is provided at both outside positions of the lead pattern 31 in the lead frame 30.

As shown in FIG. 2, the optical coupling part 10 has a main body 10*a* of the molded body 20 shaped roughly like a rectangular parallelepiped and the photoelectric conversion unit 40 attached to the front end face 21 of the main body 10*a*. An electric wiring section 23 is provided over the front end face 21 of the molded body 10*a* and exposed on a side face 22 (top face in FIGS. 1 and 2) continuous to the front end face 21. For example, an optical fiber insertion hole 24 for allowing a front end face 11*b* of the optical fiber 11 to be exposed is made at the position of each short electric wiring part 23*a* in FIG. 1. Long wiring parts 23*b* are provided at both ends of the electric wiring section 23 and between the short electric wiring parts 23*a*.

On the other hand, as shown in FIG. 2, the photoelectric conversion unit 40 is provided with a photoelectric conversion element 41 and an active layer 42 is positioned facing the optical fiber insertion hole 24 of the front end face 21 of the main body 10*a*. The photoelectric conversion unit 40 is provided with a drive electrode 43 for supplying power to the active layer 42 or sending a signal from the active layer 42. When the photoelectric conversion unit 40 is attached to the front end face 21 of the main body 10*a*, the drive electrode 43 is brought into contact with the electric wiring section 23 of the main body 10*a*.

Accordingly, when the optical coupling part 10 is mounted on a board (not shown), power is supplied through the electric wiring section 23 to the photoelectric conversion element 41, so that a light signal can be emitted to the optical fiber 11 and a light signal from the optical fiber 11 can be received and a signal can be transmitted.

FIG. 3A shows the lead frame 30 according to the present invention. The lead frame 30 has a lead pattern 31 forming the above-described electric wiring section 23 like a lead frame 30B used in a related art shown in FIG. 3B. The lead pattern 31 has short leads 31*a* forming short electric wiring parts 23*a* and long leads 31*b* forming the long wiring parts 23*b*. The lead frame 30 is notched between the leads 31*a* and 31*b* to form a space 33.

At both ends of the lead pattern 31, the protective lead 32 which does not become the electric wiring section 23 is provided in addition to a lead pattern 31 of the lead frame 30B in the related art shown in FIG. 3B. The protective leads 32 are provided in a state of a beam with both ends supported on the lead frame 30 and has a sufficient strength. A positioning hole 34 for positioning to insert the lead frame 30 into a proper position in manufacturing the optical coupling part 10 is made in four corners of the lead frame 30.

The lead pattern 31, the protective leads 32, the positioning holes 34, and the like are formed in the lead frame 30 by punching of etching, press, etc., for example.

As shown in FIG. 4, a mold 50 for manufacturing the molded body 20 into which the lead frame 30 is inserted has an upper mold 51 and a lower mold 52 and the upper and lower molds 51 and 52 are combined to form a cavity 53 for forming the main body 10*a* of the optical coupling part 10 between the upper and lower molds. Ahead of the upper and lower molds 51 and 52 (at the left in FIG. 4), a second slide core 56 for forming the molded body 20 with the front end face 21 allowing tip parts 11*a* of the optical fibers 11 (see FIG. 2) to be exposed is placed facing a first slide core 55 and positioned by positioning pins 58.

The first slide core 55 having a core pin 54 to form the molded body 20 with the optical fiber insertion holes 24 to allow the optical fibers 11 to be inserted (see FIGS. 1 and 2) is inserted between the upper and lower molds 51 and 52. A convex part 57 for adjusting the height of the first slide core 55 is provided at the center of the lower mold 52 so that the upper and lower positions can be adjusted in a nest structure. The convex part 57 adjusts the height of the first slide core 55 and supports the first slide core 55 from below at the resin pouring time and forms an adhesive pouring port (not shown) for pouring an adhesive 59 when the optical fibers 11 are fixed in the manufactured optical coupling part 10.

The second slide core 56 is provided with a positioning hole 56*a* for positioning the core pin 54 and the tip of the core pin 54 is inserted into the positioning hole 56*a*, whereby the core pin 54 can be positioned accurately in the cavity 53. The positioning pins 58 to which the second slide core 56 is attached pass through the positioning holes 34 of the lead frame 30 for precisely positioning the lead frame 30 at the proper position.

Next, a manufacturing method of the optical coupling part will be discussed.

The manufacturing method of the optical coupling part 10 is to execute insert molding of a lead frame 30 having a lead pattern 31 for making electric connection to a photoelectric conversion unit 40 placed facing optical fibers 11 on a front end face 21 of a molded body 20 for allowing a plurality of optical fibers 11 to be inserted and exposed and a side face 22 continuous to the front end face 21. To execute insert molding of the lead frame 30 into the molded body 20, the lead pattern 31 for power supply is protected by the protective leads 32 provided on both outsides of the lead pattern 31.

That is, both molds 51 and 52 are combined and the lead frame 30 is positioned by positioning pins 58 provided on front end faces 51*a* and 52*a* of the upper mold 51 and the lower mold 52 as shown in FIG. 4. A convex part 57 is adjusted to a predetermined height, a first slide core 55 is inserted, further a second slide core 56 is attached, and a mold 50 is set. Then, a resin 59 is poured into a cavity 53 in the mold 50 and insert molding of the lead frame 30 is executed to form a molded body 20. At this time, the resin 59 poured into the cavity 53 flows forward (downward in FIG. 5) from the side of the first slide core 55 and flows to the center along the lead frame 30 as shown in FIG. 5. At this time, the protective leads 32 provided on both outsides of the lead pattern 31 of the lead frame 30 moderate the flow of the resin, so that the force acting on leads 31*a* and 31*b* of the lead pattern 31 to form an electric wiring section 23 can be decreased. Thus, misregistration and deformation of the leads 31*a* and 31*b* can be prevented and insert molding of the lead frame 30 can be executed precisely at the proper position.

When the resin 59 is poured and the insert molding of the lead frame 30 is complete, the first slide core 55 and the second slide core 56 are moved away from each other and then the molded body 20 is taken out from the mold 50. An unnecessary portion of the lead frame 30 inserted and molded into the front end face 21 of the molded body 20 is cut and removed.

Then, the photoelectric conversion unit 40 is attached to the front end face 21 of the molded body 20 so that an active layer 42 of a photoelectric conversion element 41 is positioned on the front of optical fiber insertion holes 24 of the molded body 20 and a drive electrode 43 comes in contact with the electric wiring section 23 on the side of a main body 10*a*, namely, a lead pattern 31 of the lead frame 30, as shown in FIG. 2.

In the optical coupling part 10 thus manufactured, the front end face 21 of the main body 10*a* is slantingly cut for improving the transmission characteristic.

As described above, according to the lead frame, the optical coupling part using the lead frame, and the manufacturing method of the optical coupling part according to the present invention, when the resin 59 to form the molded body 20 is poured and the lead frame 30 is attached to the front end face 21 of the molded body 20 by insert molding, the protective leads 32 provided on both outsides of the lead pattern 31 of the lead frame 30 moderate the flow of the resin 59 and the force acting on the lead pattern 31 is decreased, so that misregistration and deformation of the lead pattern 31 can be prevented. Accordingly, the inserted and molded lead frame 30 can be wired on the front end face 21 of the molded body 20 for easily accomplishing three-dimensional electric wiring.

The lead frame, the optical coupling part using the lead frame, and the manufacturing method of the optical coupling part of the present invention are not limited to those in the specific embodiment described above and appropriate modifications, improvements, etc., are possible.

For example, in the embodiment described above, the protective leads 32 are provided each one on each of both outsides of the lead pattern 31 by way of example, but a plurality of protective leads 32 can also be placed on each outside. The width of the protective lead 32 may be equal to or may be different from that of the lead 31*a*, 31*b* of the lead pattern 31. For example, the width of the protective lead 32 may be larger than that of the lead 31*a*, 31*b* of the lead pattern 31. In this case, the moderation of the flow of the resin by the protective leads becomes more effective.

Further, in the embodiment described above, the leads 31*a* are provided on the upper and lower portions of the front end face 21 of the molded body 20, but the leads 31*a* may be provided only one of the upper or lower portion of the front end face 21. However, when the leads 31*a* are provided on the upper and lower portions of the front end face 21 as described above, both of side surfaces 22 of optical coupling part 10 (in FIG. 1, the upper side surface 22 and the lower surface opposed to the upper side surface 22) can be used as a surface to be mounted on the board.

As described above, in the lead frame, the optical coupling part using the lead frame, and the manufacturing method of the optical coupling part according to the present invention, since the protective leads are provided on both outsides of the lead pattern of the lead frame, when a resin to form the molded body is poured and the lead frame is attached to the front end face of the molded body by insert molding, the protective leads moderate the flow of the resin and the force acting on the lead pattern is decreased. Accordingly, misregistration and deformation of the lead pattern can be prevented and the inserted and molded lead frame can be wired on the front end face of the molded body, whereby three-dimensional electric wiring can be easily accomplished, and the present invention is useful as a lead frame for supplying power to a photoelectric conversion unit, an optical coupling part using the lead frame, a manufacturing method of the optical coupling part, etc.

What is claimed is:

1. A lead frame inserted and molded into a molded body for allowing a plurality of optical fibers to be inserted and exposed, the lead frame comprising:

a lead pattern wired on a front end face of the molded body for making electric connection to a photoelectric conversion unit placed facing the optical fibers; and protective leads which are provided at both outside positions of the lead pattern and protects the lead pattern.

2. The lead frame as claimed in claim 1 wherein the protective leads are provided in a state of a beam with both ends supported on the lead frame.

3. The lead frame as claimed in claim 1 wherein the protective leads do not make electric connection to the photoelectric conversion unit.

4. An optical coupling part comprising:

a molded body for allowing a plurality of optical fibers to be inserted and exposed;

a photoelectric conversion unit placed facing the optical fibers;

a lead frame inserted and molded into the molded body, the lead frame having a lead pattern, which is wired on a front end face of the molded body and makes electric connection to the photoelectric conversion unit, and protective leads, which are provided at both outside positions of the lead pattern in the lead frame and protects the lead pattern.

5. The optical coupling part as claimed in claim 4 wherein the protective leads do not make electric connection to the photoelectric conversion unit.

6. A manufacturing method of an optical coupling part, comprising:

preparing a lead frame having a lead pattern for making electric connection to a photoelectric conversion unit placed facing a plurality of optical fibers and protective leads provided on both outsides of the lead pattern; and executing insert molding of the lead frame into a front end face of a molded body for allowing the optical fibers to be inserted and exposed, wherein when insert molding of the lead frame into the molded body is executed, the lead pattern is protected by the protective leads.

* * * * *